United States Patent [19]

Taylor

[11] Patent Number: 5,034,728
[45] Date of Patent: Jul. 23, 1991

[54] LOW VOLTAGE WARNING APPARATUS AND METHOD

[76] Inventor: Walter E. Taylor, Rte. 2, Box 233, Liberty Hill, Tex. 78642

[21] Appl. No.: 483,083

[22] Filed: Feb. 21, 1990

[51] Int. Cl.$^5$ ............................................. G08B 21/00
[52] U.S. Cl. ................................... 340/663; 340/656; 307/358; 307/362
[58] Field of Search ...................... 340/663, 661, 656; 307/358, 360, 361, 362; 361/92, 90; 324/508, 509, 133

[56] References Cited

U.S. PATENT DOCUMENTS

| 3,749,944 | 7/1973 | Luebrecht | 307/362 |
| 4,524,317 | 6/1985 | Millard | 340/661 X |
| 4,533,865 | 8/1985 | Schlenk | 340/663 X |

OTHER PUBLICATIONS

*IBM Technical Disclosure Bulletin*, "Circuit to simplify threshold adjustments", Seeger, Jul. 1977.

Primary Examiner—Edward L. Coles, Sr.
Assistant Examiner—Jeffery A. Hofsass
Attorney, Agent, or Firm—J. Nevin Shaffer, Jr.; Russell D. Culbertson

[57] ABSTRACT

A low voltage warning apparatus is adapted to energize a low voltage indicator in response to a test voltage signal falling below the magnitude of a reference voltage signal. The test voltage signal and reference voltage signal are connected to be received by a comparator circuit so that the comparator circuit output is connected to ground when the test voltage falls below the value of the reference voltage. The low voltage indicator is connected between an indicator power supply and the comparator output so that when the comparator output is connected to ground, a low voltage indicator energizing current flows through the low voltage indicator to provide the desired low voltage indication. In the preferred form of the invention, the low voltage warning apparatus is adapted to receive an AC voltage signal through an ordinary household electrical outlet and includes a rectifier for converting the AC voltage signal into the voltage to be sensed, the voltage to be sensed being a DC voltage signal having a magnitude substantially equal to the amplitude of the received AC signal. The test voltage is held proportional to the magnitude of the DC signal to be sensed, and the reference voltage is derived from a limited and substantially constant voltage signal produced from the voltage to be sensed. The low voltage indicator is preferably energized through the reduced constant voltage signal.

12 Claims, 2 Drawing Sheets

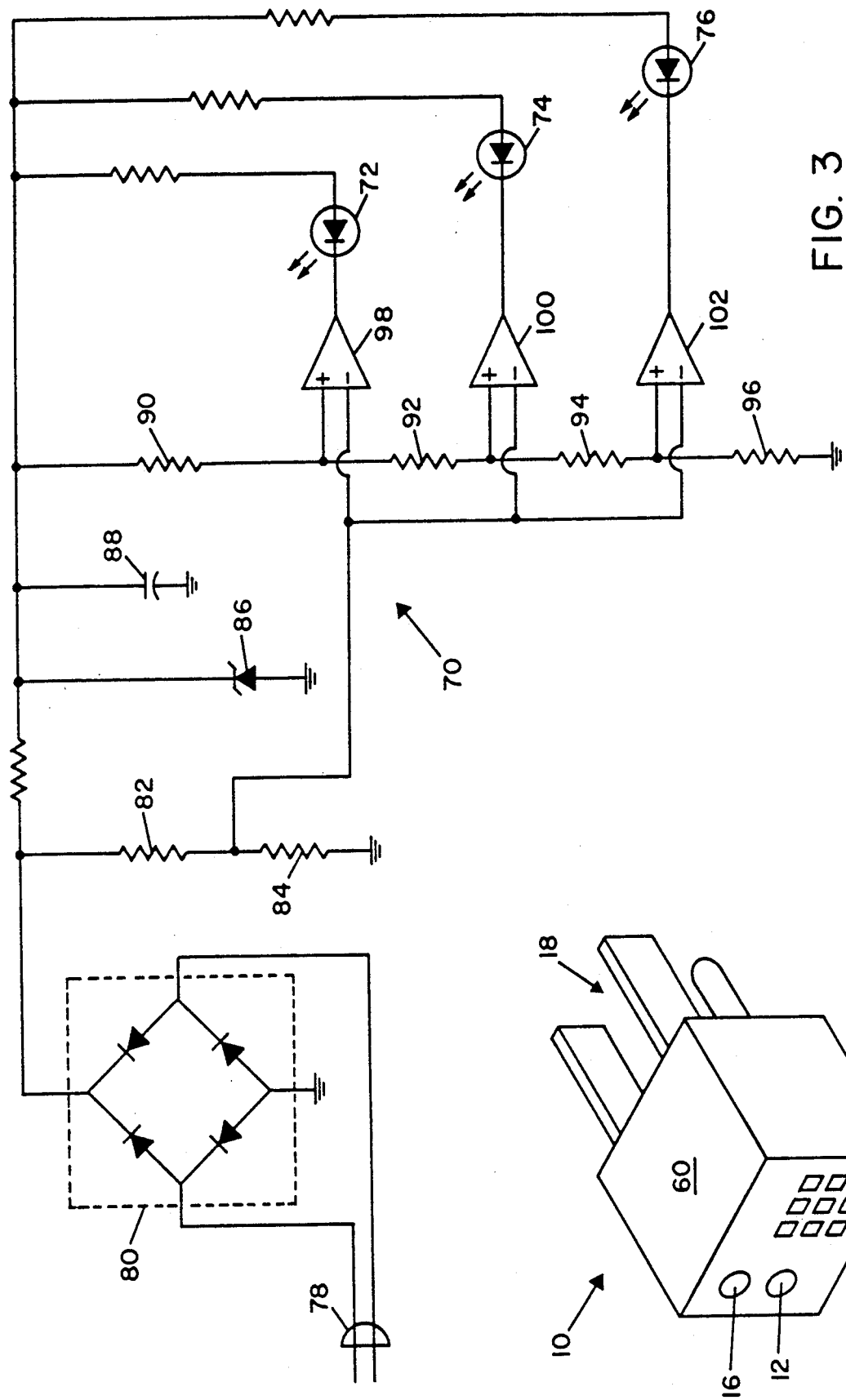

LOW VOLTAGE WARNING APPARATUS AND METHOD

BACKGROUND OF THE INVENTION

This invention relates to low voltage detecting devices and particularly to a low voltage warning apparatus for providing an indicating signal when a voltage below an acceptable level is sensed. The invention also encompasses a method of providing a low voltage warning signal.

Local electrical power distribution systems occasionally provide AC power at voltage levels below the standard level of approximately 110 volts, particularly in times of high electrical power demand. Although no electrical distribution system is completely immune to the problem of providing a low voltage signal, small distribution systems are most likely to occasionally provide AC signals below the standard 110 volt level. For example, low voltage conditions commonly occur in recreational vehicle or RV parks as such parks fill up at night and electrical consumption increases. Also, small portable AC generators such as those commonly carried by RVs may provide AC power below the standard voltage level when overloaded.

Although low AC voltage may be supplied by an electrical power distribution system under a number of different circumstances, many electrically powered devices are specifically adapted to operate on alternating current at the standard 110 volt level and may be damaged if operated on alternating current at voltage levels below the standard level. AC electric motors such as those used to power a RV's refrigerated air conditioning unit, for example, are particularly vulnerable to damage due to operation on low voltage alternating current. Furthermore, a low voltage condition sufficient to damage a piece of electrical equipment may not be noticeable from the outward appearance or operation of the device. Also, a device, such as a RV air conditioning unit, may be adapted to operate at times when the RV occupants are asleep and unable to detect any hint that might indicate a low voltage situation.

It is therefore a general object of the invention to provide a low voltage warning apparatus adapted to provide a suitable indication when a harmful low voltage condition exists. Another object of the invention is to provide a method for providing a low voltage indicating signal to alert a person to a low voltage condition.

SUMMARY OF THE INVENTION

A low voltage warning apparatus according to the invention includes low voltage indicator means and a low voltage comparing circuit. The low voltage indicator means is adapted to produce a low voltage indication in response to a low voltage indicator energizing current passing therethrough. The low voltage comparing circuit is adapted to receive a test voltage signal proportional to the magnitude of a voltage signal to be sensed and a reference signal, and to compare the two signals. When the test voltage signal drops below the reference voltage signal, the comparing circuit acts to enable the low voltage indicator energizing current to flow through the indicator means to produce a low voltage indication.

In the preferred form of the invention, the low voltage comparing circuit comprises a low voltage comparator connected to receive the test voltage signal at its non-inverting input and the reference voltage signal at its inverting input. The low voltage indicator means is connected between a suitable indicator power supply and the output of the low voltage comparator. When the test voltage signal drops below the reference voltage signal, the comparator circuit connects its output to ground so that the low voltage indicator energizing current is directed from the indicator power supply through the low voltage indicator means to provide the desired low voltage indication.

The preferred reference voltage signal is derived from a reduced and substantially constant voltage signal which is produced from the voltage signal to be sensed with suitable voltage limiting means. The substantially constant voltage signal is substantially less in magnitude than the voltage to be sensed and is generally independent of voltage fluctuations in the signal to be sensed above the constant voltage magnitude. The preferred low voltage indicator energizing current is also preferably supplied through the substantially constant voltage signal provided by the voltage limiting means.

Although the low voltage warning apparatus of the invention serves to provide an indication of a low voltage AC signal, the voltage to be sensed is a DC voltage signal. The apparatus therefore includes suitable rectifier means for receiving an AC voltage signal and for producing the DC voltage signal to be sensed having a magnitude substantially equal to the amplitude of the AC voltage signal. The DC voltage signal to be sensed provides not only the test voltage signal but also provides the reference voltage signal and the low voltage indicator energizing current, both through the voltage limiting means.

In one preferred form of the invention, the low voltage indicator means includes a low voltage visual indicator such as a suitable LED device capable of producing a visual indication in response to the low voltage indicator energizing current. However, the low voltage indicator means may also or alternatively include an audio indicator such as a piezoelectric buzzer or similar device.

In addition to providing a low voltage signal, a low voltage warning apparatus according to the invention may also include means for providing an indication when a normal voltage signal is being received. To provide a normal voltage indication, the apparatus preferably includes normal voltage indicator means such as an LED adapted to provide a visual indication in response to a normal voltage energizing current, and a normal voltage comparing circuit. The normal voltage comparing circuit is adapted to receive the test voltage signal and the normal voltage signal and to energize the normal voltage indicator when the test voltage signal equals or exceeds the reference voltage signal. In the preferred form of the invention, the normal voltage comparing circuit includes a normal voltage comparator adapted to receive the test voltage signal at its inverting input and the reference voltage signal at its non-inverting input. The normal voltage indicator means is connected between the indicator power supply and the normal voltage comparator output and the comparator is adapted to connect its output to ground when the test voltage equals or exceeds the reference voltage to allow the normal voltage energizing current to flow through the normal voltage indicator.

In the preferred form of the invention, the low voltage warning apparatus includes a device housing in which the various circuit elements are contained and in which the indicator means are mounted for providing the desired indication outside of the housing. A suitable AC power connector extends from the housing and is adapted to be received in an AC power receptacle for receiving the AC voltage signal and for supporting the device housing adjacent to the receptacle. Thus, the preferred device is adapted to be plugged into an ordinary AC power receptacle and provide a low voltage indication when the amplitude of the AC signal at the receptacle drops to a harmful low voltage level.

Other forms of the invention are adapted to provide a normal voltage indication and low voltage indication simultaneously when a normal voltage AC signal is received. In this form of the invention, the normal voltage indication ceases, leaving only the low voltage indication when a low voltage condition is sensed. This alternate form of the low voltage warning apparatus may also include a marginal voltage indicator that provides a marginal voltage indication as long as the AC voltage amplitude being sensed remains above a marginal level.

This simultaneous indication form of the invention includes a suitable rectifier for receiving the AC voltage signal under scrutiny and for producing a DC voltage to be sensed having a magnitude substantially equal to the amplitude of the received AC voltage signal. The simultaneous indication form of the invention also includes voltage limiting means for receiving and reducing the voltage signal to be sensed to a substantially constant voltage signal. A low voltage reference signal, marginal voltage reference signal, and normal voltage reference signal are each derived from the constant voltage signal produced from the signal to be sensed by the voltage limiting means.

The simultaneous indication form of the invention also preferably includes a low voltage comparator, a normal voltage comparator, and a marginal voltage comparator, adapted to receive a test voltage signal proportional to the magnitude of the signal to be sensed and to compare the test voltage signal with the low voltage, normal voltage, and marginal voltage reference signals, respectively. Each comparator is adapted to enable an indicator energizing current to flow through a respective indicator as long as the test voltage equals or exceeds the reference voltage.

The method of providing a low voltage warning according to the preferred form of the invention includes first producing a reference voltage signal and a test voltage signal from a voltage signal to be sensed, and then comparing the reference voltage signal and the test voltage signal. When the test voltage signal drops below the reference voltage signal, the method includes directing a low voltage indicator energizing current through a low voltage indicator and producing a low voltage indication in response to the low voltage indicator energizing current.

The preferred comparing step includes directing the reference voltage signal to the inverting input of a suitable comparator circuit and directing the test voltage signal to the non-inverting input of the comparator circuit, the comparator circuit being adapted to connect its output to ground when the test voltage drops below the reference voltage signal. Directing the low voltage energizing current through the low voltage indicator includes connecting the low voltage indicator between an indicator power supply and ground through the comparator output. Thus, the low voltage indicator receives the low voltage indicator energizing current from the indicator power supply only when the test voltage signal drops below the reference voltage signal.

The preferred method of the invention includes the step of rectifying an AC voltage signal to produce the voltage signal to be sensed at a magnitude substantially equal to the amplitude of the AC voltage signal. Producing the reference voltage signal includes receiving and reducing the voltage signal to be sensed to a substantially constant voltage signal by suitable voltage limiting means. The reference voltage signal and the low voltage indicator energizing current are preferably both derived or produced from this constant voltage signal.

In addition to providing a low voltage warning indication, the preferred method of the invention also includes the step of producing a normal voltage indication when the test voltage signal equals or exceeds the reference voltage signal. This step of producing a normal voltage indication includes directing a normal voltage indicator energizing current through a normal voltage indicator. Similar to the method of directing the low voltage indicator energizing current, the normal voltage indicator energizing current is preferably controlled by a comparator. This normal voltage comparator is adapted to connect the normal voltage indicator to ground when the test voltage signal equals or exceeds the reference voltage signal so that the normal voltage indicator energizing current flows from the indicator power supply through the normal voltage indicator to provide the normal voltage indication.

These and other objects, advantages, and features of the invention will be apparent from the following description of the preferred embodiments, considered along with the accompanying drawings.

BRIEF DESCRIPTION OF THE DRAWINGS

FIG. 2 is a mostly representational view in perspective of the preferred low voltage warning apparatus.

FIG. 3 is a schematic representation of an alternate low voltage warning apparatus according to the invention.

DESCRIPTION OF THE PREFERRED EMBODIMENTS

Figure 1:
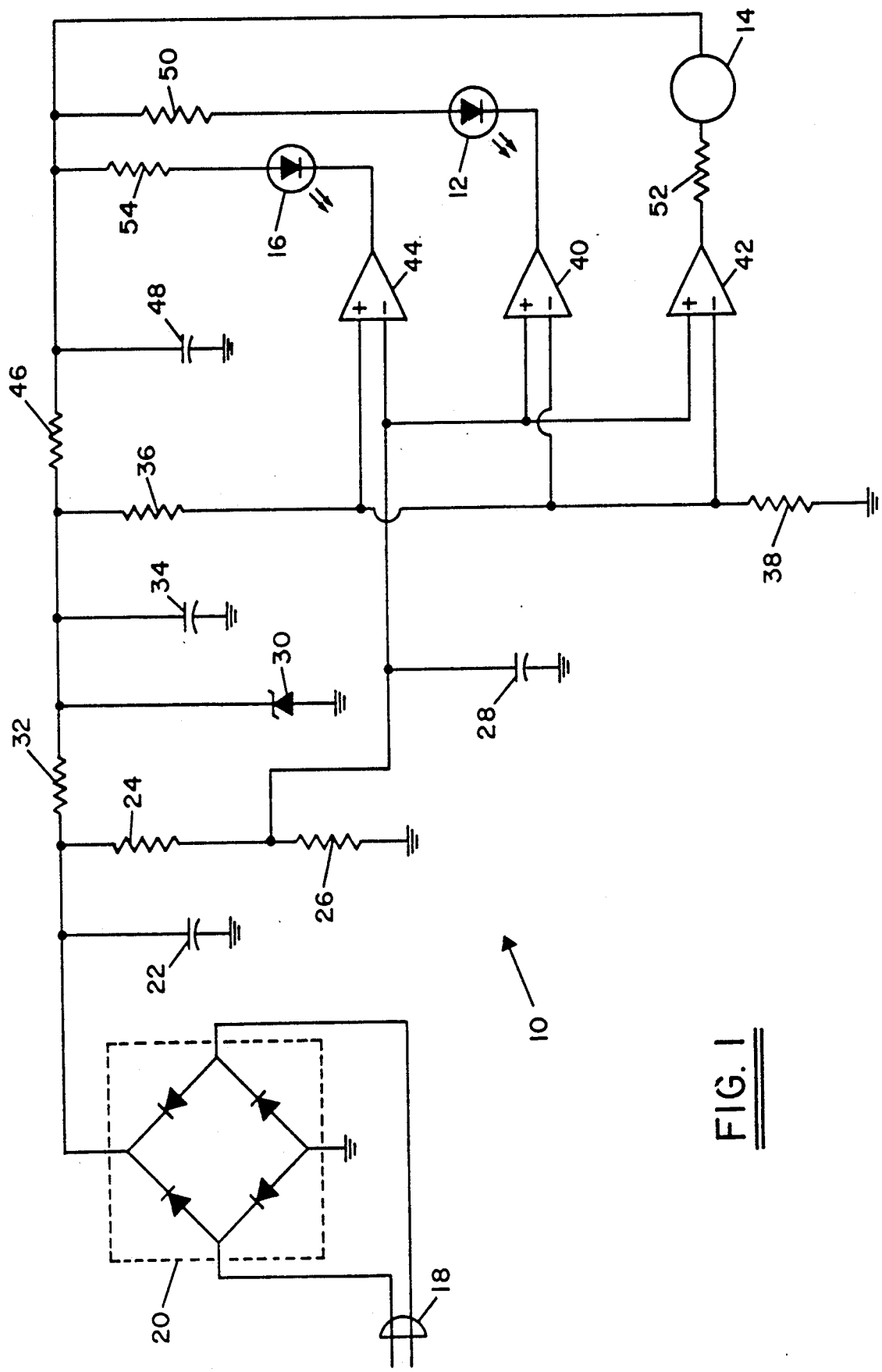
FIG. 1 is a schematic representation of a low voltage warning apparatus embodying the principles of the invention.

Referring to FIG. 1, a low voltage warning apparatus 10 embodying the principles of the invention is adapted to receive an AC voltage signal and to provide an indication when the amplitude of the AC signal drops below a predetermined low voltage level. The apparatus 10 includes low voltage indicator means, in this form of the invention, a low voltage LED 12 for providing a visual low voltage indication, and a suitable audio indicator 14 for providing an audible low voltage warning indication. The preferred form of the invention illustrated in FIG. 1 is also adapted to provide a normal voltage indication when the amplitude of the AC signal received is above the predetermined low voltage warning level. The normal voltage indicator means includes a normal voltage LED 16 for providing a visual indication when the normal voltage condition is sensed.

The AC voltage signal is received through a suitable AC plug 18 and is rectified by suitable rectifying means to produce a DC voltage signal to be sensed. The preferred rectifying means includes a full wave bridge rectifying network 20. A suitable filter capacitor 22 is preferably included in the apparatus 10 to smooth out the rectified AC voltage signal.

The low voltage warning apparatus 10 also includes test voltage means for providing a test voltage signal that is proportional to the signal to be sensed. The preferred test voltage means shown in FIG. 1 includes a voltage divider network including voltage divider resisters 24 and 26. The test voltage means also preferably includes a test voltage filter capacitor 28 adapted to quiet the output of the test voltage divider network and produce a more level test voltage signal.

The low voltage warning apparatus 10 also includes reference voltage means for producing a reference voltage signal that is substantially independent of amplitude fluctuations in the AC input signal and magnitude of the DC signal to be sensed. The preferred reference voltage means includes a zener diode 30 connected to receive the voltage signal to be sensed reduced through a resistor 32. The resistor 32 drops the voltage signal to be sensed down to a level that the zener diode 30 can withstand over extended operation. The zener diode 30 serves to conduct to ground substantially any voltage signal received over a desired voltage level to produce a substantially reduced constant voltage signal that is substantially unaffected by most fluctuations that may occur in the AC input signal and the DC signal to be sensed. The preferred reference voltage means shown in FIG. 1 also includes a reference voltage filter capacitor 34 and a reference voltage divider network including resistor 36 and resistor 38 connected to ground.

The embodiment shown in FIG. 1 also includes low voltage comparing means comprising a first low voltage comparator 40 and a second low voltage comparator 42. A normal voltage comparing means comprises a normal voltage comparator 44. All of the comparators 40, 42, and 44 may preferably be implemented on a single integrated circuit chip although individually packaged comparators may be used according to the invention. Although the power connections for the comparators are not shown in FIG. 1, each comparator 40, 42, and 44 may preferably be connected to receive operating power from the substantially constant voltage signal produced by the zener diode 30 and filter capacitor 34. A comparator resistor 46 and comparator filter capacitor 48 are preferably used to further condition the substantially constant voltage signal to produce a suitable comparator operating voltage signal.

The first and second low voltage comparators 40 and 42 are each connected to receive the reference voltage signal produced through the reference voltage means at their respective inverting input and the test voltage signal at their respective non-inverting input. With this input connection, the comparators 40 and 42 are both adapted to connect their respective outputs to ground when the test voltage signal drops below the reference voltage signal. The low voltage LED 12 is connected between a suitable indicator power supply and the first low voltage comparator 40 output so that a low voltage indicator energizing current may flow through the low voltage LED when the test voltage signal drops below the reference voltage signal and the comparator output goes to ground. A current limiting resistor 50 limits the low voltage energizing current to a level suitable for operating the low voltage LED 12. Similarly, the audio indicator 14 is connected between the indicator power supply and the output of the second low voltage comparator 42 along with a current limiting resistor 52. As shown in FIG. 1, the same signal used to power the comparators 40, 42, and 44 is preferably used as the indicator power supply.

The normal voltage comparator 44 is connected to receive the test voltage signal at its inverting input and the reference voltage signal at its non-inverting input, opposite to the input connections to the comparators 40 and 42. With these input connections, the normal voltage comparator 44 is adapted to connect its output to ground when the test voltage exceeds the reference voltage. The normal voltage LED 16 is connected between the indicator power supply and the output of comparator 44 so that a normal voltage indicator energizing current flows through the LED 16 in response to the test voltage signal having greater magnitude than the reference voltage signal received at the comparator 44 inputs. A current limiting resistor 54 limits the normal voltage indicator energizing current to a level acceptable to the LED 16.

In operation, the low voltage warning apparatus 10 shown in FIG. 1 receives an AC voltage signal through the AC plug 18 and then rectifies the AC signal with the full wave rectifier 20. The full wave rectified AC signal is then preferably filtered with the filter capacitor 22 to provide a relatively constant DC voltage signal to be sensed. The DC voltage signal to be sensed is then used by the preferred apparatus 10 to produce both the test voltage signal and the reference voltage signal.

The test voltage signal is produced through the voltage dividing network comprised of resistors 24 and 26. This test voltage signal is proportional to the magnitude of the voltage to be sensed and is preferably conditioned further with the test voltage filter capacitor 28. The test voltage signal is directed to the non-inverting input connection of the two low voltage comparators 40 and 42 and to the inverting input of the normal voltage comparator 44.

The reference voltage signal is produced from the DC voltage to be sensed by first reducing the signal through the resistor 32 to a voltage level that the zener diode 30 can withstand and then limiting the signal from the resistor 32 to the breakdown voltage of the zener diode. This voltage limiting at the zener diode 30 produces a substantially constant voltage signal from which the reference voltage signal is derived. In the preferred form of the invention, the limited substantially constant voltage signal is first filtered by the capacitor 34 before being dividing by the reference voltage divider network comprised of resistors 36 and 38 to produce the desired reference voltage signal which is proportional to a low voltage level at which a warning indication is desired. The reference voltage signal from the reference voltage dividing network is then directed to the non-inverting input of the normal voltage comparator 44 and to the inverting input of the two low voltage comparators 40 and 42.

When the test voltage signal remains above the magnitude of the reference voltage signal, the two low voltage comparators 40 and 42 provide a high level voltage signal at their respective output while the normal voltage comparator 44 connects its output to ground. This ground connection through the comparator 44 output allows the normal voltage indicator energizing current, limited by the limiting resistor 54, to energize the normal voltage LED 16 to provide a normal voltage indication of a particular color, green, for example. However, when the voltage signal to be sensed falls below the predetermined low voltage level, the test voltage signal is adapted to fall below the level of the reference voltage signal which remains constant due to the voltage limiting zener diode 30 unless the voltage signal to be sensed actually drops below the magnitude of the zener diode breakdown voltage. With the reference voltage signal greater than the test voltage signal, the normal voltage comparator 44 produces a high level output to prevent the energizing current from flowing through the normal voltage LED 16, and the two low voltage comparators 40 and 42 connect their respective output to ground. This output condition at comparators 40 and 42 allows the low voltage indicator energizing current to flow through both the low voltage LED 12 and the audio indicator 14 through their respective current limiting resistors 50 and 52. The low voltage LED 12 is adapted to produce a signal different in color from LED 16, such as red, to indicate the potentially harmful low voltage condition.

As shown in FIG. 2, the low voltage apparatus 10 according to the invention is preferably contained within a housing 60 made of a suitable plastic or other dielectric material. The AC connector 18 is adapted to extend from a rear side of the housing in position to be plugged into a suitable electrical outlet receptacle (not shown), preferably a common grounded household electrical outlet. The preferred green normal voltage LED 16 and the red low voltage LED 12 are mounted within the housing 60 so as to provide the particular visual indicating signal outside of the housing. The housing 60 also preferably includes suitable sound outlet means generally indicated at 62 for conducting the audible signal produced by the audio indicator 14 which is also preferably mounted inside the housing.

FIG. 3 illustrates an alternate low voltage indicator apparatus 70 according to the invention. The low voltage warning apparatus 70 includes a normal voltage visual indicator LED 72, a marginal voltage indicator LED 74, and a low voltage indicator LED 76. The apparatus 70 is adapted to energize each LED to provide three different color indications in a normal voltage condition, different color marginal and low voltage indications in a marginal voltage condition, and only a low voltage indication in a low voltage condition.

The alternate low voltage warning apparatus 70 includes an AC plug 78 adapted to receive an AC voltage signal to be sensed and a full wave rectifier 80 similar to the embodiment shown in FIG. 1. Also, a test voltage dividing network including resistors 82 and 84 produces a test voltage signal proportional in magnitude to the signal to be sensed, and a voltage limiting zener diode 86 and filter capacitor 88 produce a substantially constant voltage signal from which a series of reference voltage signals may be derived.

However, unlike the embodiment shown in FIG. 1, the alternate low voltage warning apparatus 70 includes a reference voltage divider network comprising resistors 90, 92, 94, and 96 for producing three separate reference voltage signals. A normal voltage reference signal is directed to the non-inverting input of a normal voltage comparator 98, a marginal reference voltage signal is directed to the non-inverting input of a marginal voltage comparator 100, and a low voltage reference signal is directed to the non-inverting input of a low voltage comparator 102. Each of the comparators 98, 100, and 102 are connected to receive the test voltage signal at their respective inverting input. Also, LEDs 72, 74, and 76, along with a current limiting resistor, are connected between the substantially constant voltage signal and the output of comparators 98, 100, and 102 respectively.

In this form of the invention, when the AC signal amplitude is above a predetermined normal level, the test voltage signal exceeds each reference voltage signal so that the comparators 98, 100, and 102 each have their output connected to ground and an energizing current flows through each of the LEDs 72, 74, and 76 to produce a normal voltage indication. As the AC amplitude falls below a marginal level, the test voltage signal falls below the normal voltage reference signal to produce a high signal at the output of the normal voltage comparator 98. In this condition, the normal voltage LED 72 will not be energized but the marginal and low voltage LEDs 74 and 76, respectively, will remain energized to indicate a marginal voltage condition. When the AC signal amplitude falls below a predetermined low voltage warning level, the test voltage signal falls below the magnitude of the marginal reference voltage signal so that the marginal voltage comparator 100 produces a high signal at its output to block current that would otherwise flow through the marginal voltage LED 74. This low voltage condition leaves only the low voltage LED 76 energized to provide a low voltage indication.

The above described preferred embodiments are intended to illustrate the principles of the invention, but not to limit the scope of the invention. Various other embodiments and modifications to these preferred embodiments may be made by those skilled in the art without departing from the scope of the following claims.

I claim:

1. A low voltage warning apparatus comprising:
   (a) voltage limiting means for receiving and reducing a voltage signal to be sensed to a substantially constant voltage signal, the constant voltage signal being substantially less in magnitude than the voltage to be sensed and being independent of voltage fluctuations in the signal to be sensed above the constant voltage signal magnitude;
   (b) means for producing a reference voltage signal from the constant voltage signal produced by the voltage limiting means;
   (c) test voltage means for receiving the voltage signal to be sensed, and producing a test voltage signal proportional to the magnitude of the signal to be sensed;
   (d) low voltage indicator means connected for producing a low voltage indication in response to a low voltage indicating energizing current supplied through the substantially constant voltage signal provided by the voltage limiting means; and
   (e) low voltage comparing means connected to receive the reference voltage signal and the test voltage signal for enabling the low voltage indicator energizing current to flow through low voltage indicator means when the test voltage signal drops below the reference voltage signal.

2. The low voltage warning apparatus of claim 1 wherein:
   (a) the low voltage indicator means includes a low voltage visual indicator for producing a visual indication in response to the low voltage indicator energizing current passing therethrough.

3. The low voltage warning apparatus of claim 1 wherein:
   (a) the low voltage indicator means includes a low voltage audio indicator for producing an audio indication in response to the low voltage indicator energizing current passing therethrough.

4. The low voltage warning apparatus of claim 1 including:
   (a) rectifier means for receiving an AC voltage signal and producing the voltage to be sensed, the voltage to be sensed being a DC voltage signal having a magnitude substantially equal to the amplitude of the AC voltage signal.

5. The low voltage warning apparatus of claim 4 including:
   (a) a device housing in which the indicator means are mounted for providing the desired indication outside of the housing; and
   (b) an AC power connector adapted to be received in an AC power receptacle for receiving the AC voltage signal and for supporting the device housing adjacent to the AC power receptacle.

6. The low voltage warning apparatus of claim 1 further comprising:
   (a) normal voltage indicator means connected for producing a normal voltage indication in response to a normal voltage energizing current; and
   (b) normal voltage comparing means connected to receive the reference voltage signal and the test voltage signal for enabling the normal voltage indicator energizing current to flow through the normal voltage indicator means when the test voltage signal equals or exceeds the reference voltage signal.

7. The low voltage warning apparatus of claim 6 wherein:
   (a) the normal voltage comparing means includes a normal voltage comparator circuit connected to receive the test voltage signal at its inverting input and the reference voltage signal at its non-inverting input; and
   (b) the normal voltage indicator means is connected between the indicator power supply and the normal voltage comparator circuit output so that when the test voltage signal equals or exceeds the reference voltage signal, the comparator circuit connects the normal voltage indicator means to ground to direct the normal voltage indicator energizing current through the normal voltage indicator means from the indicator power supply.

8. The low voltage warning apparatus of claim 7 wherein the normal voltage indicator energizing current is supplied through the substantially constant voltage signal provided by the voltage limiting means.

9. The low voltage warning apparatus of claim 6 wherein:
   (a) the normal voltage indicator means comprises a normal voltage visual indicator adapted for producing a visual indication in response to the normal voltage indicator energizing current.

10. A method of providing a low voltage warning comprising the steps of:
    (a) receiving and reducing a voltage signal to be sensed to a substantially constant voltage signal substantially lower in magnitude than the voltage signal to be sensed;
    (b) producing a reference voltage signal from the constant voltage signal;
    (c) producing a test voltage signal from the voltage signal to be sensed, the test voltage signal being proportional in magnitude to the voltage signal to be sensed;
    (d) comparing the reference voltage signal to the test voltage signal;
    (e) directing a low voltage indicator energizing current produced from the constant voltage signal through a low voltage indicator when the test voltage signal drops below the reference voltage signal; and
    (f) producing a low voltage indication in response to the flow of low voltage indicator energizing current through the low voltage indicator.

11. The method of claim 10 including the steps of:
    (a) rectifying an AC voltage signal to produce the voltage signal to be sensed, the voltage signal to be sensed being a DC voltage signal having a magnitude substantially equal to the amplitude of the AC voltage signal.

12. The method of claim 11 including the steps of:
    (a) directing a normal voltage indicator energizing current through a normal voltage indicator when the test voltage signal equals or exceeds the reference voltage signal; and
    (b) producing a normal voltage indication in response to the flow of the normal voltage indicator energizing current through the normal voltage indicator.

* * * * *